(12) United States Patent  
Gao et al.

(10) Patent No.: US 7,666,567 B2
(45) Date of Patent: Feb. 23, 2010

(54) NEGATIVE IMAGING METHOD FOR PROVIDING A PATTERNED METAL LAYER HAVING HIGH CONDUCTIVITY

(75) Inventors: Feng Gao, Hockessin, DE (US); Lynda Kaye Johnson, Wilmington, DE (US); Roupen Leon Keusseyan, Raleigh, NC (US); Irina Malajovich, Swarthmore, PA (US); Jeffrey Scott Meth, Landenberg, PA (US); Kenneth George Sharp, Landenberg, PA (US); Fredrick Claus Zumsteg, Jr., Wilmington, DE (US); Seema Agrawal, Newark, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 45 days.

(21) Appl. No.: 11/877,633

(22) Filed: Oct. 23, 2007

(65) Prior Publication Data

US 2009/0104557 A1 Apr. 23, 2009

(51) Int. Cl.
*G03C 8/00* (2006.01)
(52) U.S. Cl. ........................ 430/200; 430/201
(58) Field of Classification Search ............... 430/200, 430/201
See application file for complete search history.

(56) References Cited

U.S. PATENT DOCUMENTS

| 4,743,091 | A | 5/1988 | Gelbart |
| 5,256,506 | A | 10/1993 | Ellis et al. |
| 5,418,301 | A | 5/1995 | Hult et al. |
| 5,459,016 | A | 10/1995 | Debe et al. |
| 5,494,781 | A | 2/1996 | Ohtani et al. |
| 5,663,247 | A | 9/1997 | Sorensen et al. |
| 5,994,489 | A * | 11/1999 | Harris et al. ............ 528/12 |
| 6,228,555 | B1 | 5/2001 | Hoffend, Jr. et al. |
| 6,617,418 | B1 | 9/2003 | Magnusson et al. |
| 6,645,681 | B2 | 11/2003 | Andrews et al. |
| 6,717,048 | B2 | 4/2004 | Ueda et al. |
| 6,765,082 | B2 | 7/2004 | Sunder et al. |
| 6,846,568 | B2 * | 1/2005 | Yamaya et al. ......... 428/447 |
| 7,270,887 | B2 * | 9/2007 | Yamaya et al. ......... 428/447 |
| 2001/0006766 | A1 | 7/2001 | O'Brien et al. |
| 2003/0017277 | A1 | 1/2003 | Young et al. |
| 2005/0038009 | A1 | 2/2005 | Starke et al. |

(Continued)

FOREIGN PATENT DOCUMENTS

AU 676356 B2 3/1997

(Continued)

OTHER PUBLICATIONS

G. G. Gawrilov, Chemical (Electroless) Nickel Plating, 1979, Portculis Press, Redhill, UK (Book Not Included).

(Continued)

*Primary Examiner*—Amanda C. Walke
(74) *Attorney, Agent, or Firm*—Gail D. Tanzer

(57) ABSTRACT

Disclosed is a method negative imaging method for making a metal pattern with high conductivity comprising providing a patterned substrate comprising a patterned catalyst layer on a base substrate by a thermal imaging method followed by plating to provide the metal pattern. The metal patterns provided are suitable for electrical devices including electromagnetic interference shielding devices and touchpad sensors.

8 Claims, 2 Drawing Sheets

U.S. PATENT DOCUMENTS

| | | | |
|---|---|---|---|
| 2005/0038010 A1 | 2/2005 | Cao et al. | |
| 2006/0199096 A1 | 9/2006 | Keusseyan | |
| 2006/0263725 A1 | 11/2006 | Nguyen et al. | |
| 2008/0114532 A1* | 5/2008 | Nishida et al. | 701/200 |
| 2009/0023587 A1* | 1/2009 | Huynh et al. | 503/227 |

FOREIGN PATENT DOCUMENTS

| | | |
|---|---|---|
| FR | 2030145 A | 10/1970 |
| WO | 03/099574 | 12/2003 |

OTHER PUBLICATIONS

M. Matsuoka, Infrared Absorbing Materials, 1990, Plenum Press, New York (Book Not Included).

M. Matsuoka, Absorption Spectra of Dyes for Diode Lasers, 1990, Bunshin Publishing Co., Toykyo (Book Not Included).

Riedel, Electroless Nickel Plating, 1991, Finishing Publications, pp. 34-36, Stevenage, UK (Book Not Included).

Pavnovic et al., Fundamentals of Electrochemical Deposition, 2nd Edition, John Wiley & Sons (Book Not Included).

P. Shah et al., Ink Jet Printing of Catalyst Patterns for Electroless Metal Deposition, Langmuir, 1995, pp. 1584-1587, vol. 15.

H. Simon, Vorbehandlung Metallischer Werkstoffe Zum Galvanischen Abscheiden Funktioneller Schichten Auch Auf Weniger Gebrauchlichen Metallen, Galvanotechnik, 1983, pp. 776-771, vol. 74.

P. C. Hidber et al., New Strategy for Controlling the Size and Shape of Metallic Features Formed by Electroless Deposition of Copper: Microcontact Printing of Catalysts on Oriented Polymers, Followed by Thermal Shrinkage, Langmuir, 1996, pp. 5209-5215, vol. 12.

International Search Report, International Application PCT/US2008/08055, Mailed Mar. 5, 2009.

IBM Technical Disclosure Bulletin, Direct Write Process for MLC, New York, vol. 35, No. 1B, Jun. 1, 1992, p. 427 (XP000309123).

Research Disclosure, Thermal Transfer Printing for Circuit Boards, Mason Publications, Hamshpire UK, No. 311, Mar. 1, 1990, p. 218 (XP000104497).

* cited by examiner

NEGATIVE IMAGING METHOD FOR PROVIDING A PATTERNED METAL LAYER HAVING HIGH CONDUCTIVITY

FIELD OF INVENTION

The invention relates to methods for providing conducting metal patterns for electrical applications.

BACKGROUND

Electromagnetic interference shields and touch screens for light transmissive surfaces, such as displays, typically include a conducting metal mesh mounted on a substrate. The mesh allows a substantial portion of visible light to pass, while shielding other electromagnetic radiation. There are a variety of methods available to manufacture such metal mesh articles. For instance, U.S. Pat. No. 6,717,048 discloses an electromagnetic shielding plate having a glass substrate and a geometric pattern formed on the substrate in an off-set printing process.

New methods useful for providing conducting metal patterns are needed that allow high resolution and precise digital control of the pattern being formed; for instance with a capability to prepare mesh having fine lines, down to 10 micron line-width. In addition, it is desirable to minimize wet processing steps and the use of solvents, etchants, and masks, typically used in conventional photolithography methods. Eliminating wet processing steps and solvents would give an overall method that is significantly more environmental friendly than conventional methods used in making metal mesh.

SUMMARY OF INVENTION

One embodiment of the invention is a negative imaging method for making a patterned metal layer having high conductivity comprising:

providing a patterned substrate comprising a patterned catalyst layer on a base substrate; said patterned substrate made by a thermal imaging method comprising:

(a) providing a thermal transfer donor comprising a base film and a catalyst transfer layer, wherein the catalyst transfer layer comprises: (i) a catalyst fraction; optionally (ii) an adhesion promoter fraction; and, optionally and independently, (iii) a polymer binder fraction;

(b) contacting the thermal transfer donor with a receiver, wherein the receiver comprises a base layer; and (c) removing at least a portion of the catalyst transfer layer from the donor by thermal transfer to provide a patterned donor as said patterned substrate, and an exposed receiver; and (d) removing the exposed receiver from the patterned substrate; followed by plating metal onto said patterned substrate, to provide the patterned metal layer in connectivity with the patterned catalyst layer.

DETAILED DESCRIPTION

Figure 1A:
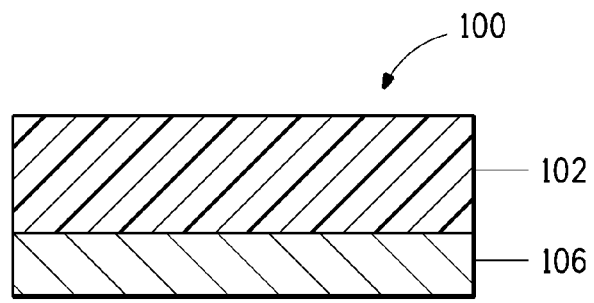
FIGS. 1A and B are cross-sectional views of various thermal imaging donors 100 in accordance with embodiments of the invention.

All trademarks herein are designated with capital letters.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl(meth)acrylate, ethyl(meth)acrylate, butyl(meth)acrylate, 2-hydroxyethyl(meth)acrylate, (meth)acrylic acid and glycidyl (meth)acrylate. The term copolymer herein encompasses polymers derived from polymerization of two or more monomers, unless specifically defined otherwise. The term (meth) acrylic acid encompasses both methacrylic acid and acrylic acid. The term (meth)acrylate, encompasses methacrylate and acrylate.

The terms "styrene acrylic polymers", "acrylic styrene" and "styrene acrylic" are synonymous and encompass copolymers of the above described "acrylic resins" with styrene and substituted styrene monomers, for instance alpha-methyl styrene.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

The term "mesh" herein refers to a weblike pattern or construction. A mesh includes, for instance, a free-standing screen, and a weblike pattern adhered or mounted on a base layer.

The terms "thermal imaging donor" and "thermal transfer donor" may be used interchangeably herein, and are intended to be synonymous.

One embodiment of the invention is a method for making a patterned metal layer having high conductivity comprising:

providing a patterned substrate comprising a patterned catalyst layer on a base substrate wherein the patterned substrate is made by a thermal imaging method comprising:

(a) providing a thermal transfer donor comprising a base film and a catalyst transfer layer, wherein the catalyst layer comprises: (i) a catalyst fraction; optionally (ii) an adhesion promoter fraction; and, optionally and independently, (iii) a polymer binder fraction.

(b) contacting the donor with a receiver, wherein the receiver comprises a base layer; and (c) removing at least a portion of the catalyst transfer layer from the donor by thermal transfer to provide a patterned donor as said patterned substrate; and (d) removing the exposed receiver from the patterned substrate; followed by plating of metal onto said patterned substrate, to provide the patterned metal layer in connectivity with the patterned catalyst layer. The patterned metal layer provided by the method can be in the form of a metal mesh adhered to the substrate or, if so desired, detached from the substrate.

Herein first will be disclosed the details of the thermal transfer donor required for the thermal imaging method; followed by the details of the thermal imagining method; and the plating step.

In various embodiments the thermal transfer donor comprises, in layered sequence, a base film, an optional LTHC layer, a catalyst transfer layer and an optional protective strippable cover layer. Other embodiments can include one or more additional layers interposed between the base film and the catalyst transfer layer. Thus, one or more other conventional thermal transfer donor element layers can be included in the thermal imaging donor, including but not limited to an interlayer, primer layer, release layer, ejection layer, thermal insulating layer, underlayer, adhesive layer, humectant layer, and light attenuating layer.

FIG. 1A is a cross-sectional view of a thermal imaging donor 100 in accordance with one embodiment of the invention. Thermal imaging donor 100 comprises base film 102, and a catalyst layer 106 on the surface of the base film 102. Base film 102 provides support to the other layers of thermal imaging donor 100. Base film 102 comprises a flexible polymer film that is preferably transparent. A suitable thickness for base film 102 is about 25 µm to about 200 µm, although thicker or thinner support layers may be used. The base film may be stretched by standard processes known in the art for producing oriented films and one or more other layers, such as a light-to-heat-conversion (LTHC) layer, may be coated onto the base film prior to completion of the stretching process. Preferred base films comprise a material selected from the group consisting of: polyethylene terephthalate (PET), polyethylene naphthalate (PEN), triacetyl cellulose, glass and polyimide.

Light-Attenuating Agent

A light-attenuating agent may be present in a discrete layer or incorporated in one of the other functional layers of the thermal transfer donor, such as the base film, the LTHC layer or the catalyst layer. In one embodiment, the base film comprises a small amount (typically 0.2% to 0.5% by weight of the base film) of a light-attenuating agent (absorber or diffuser) such as a dye, which can assist in the focusing of the radiation source onto the radiation-absorber in the LTHC layer during the thermal imaging step, thereby improving the efficiency of the heat transfer. U.S. Pat. No. 6,645,681 describes this and other ways in which the base film may be modified to assist in the focusing of a laser radiation source in which the equipment comprises an imaging laser and a non-imaging laser, and wherein the non-imaging laser has a light detector that is in communication with the imaging laser. The wavelength ranges at which the imaging and non-imaging laser operate (typically in the range from about 350 nm to about 1500 nm) determine the wavelength ranges in which the absorber(s) and/or diffuser(s) are active and inactive. For example, if the non-imaging laser operates in about the 670 nm region and the imaging laser at 830 nm, it is preferred that the absorber and/or diffuser operate to absorb or diffuse light in the 670 nm region, rather than in the 830 nm region. Herein, the light attenuating agent preferably absorbs or diffuses light in the visible region, and in one embodiment absorbs around 670 nm. Suitable light-attenuating agents are well known in the art and include the commercially available Disperse Blue 60 and Solvent Green 28 dyes and carbon black. Preferably the amount of light-attenuating agent is sufficient to achieve an optical density (OD) of 0.1 or greater at some wavelength of about 400 to about 750 nm, more preferably about 0.3 to about 1.5.

Light-to-Heat Conversion Layer (LTHC)

Figure 1B:
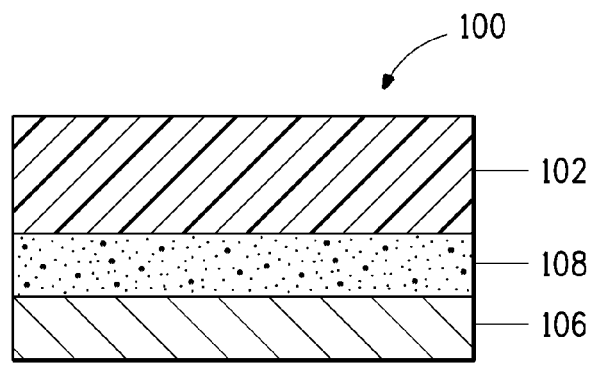

The thermal imaging donor may, optionally, have a light-to-heat-conversion layer (LTHC), interposed between the base film and the other layers as illustrated in FIG. 1B. Thermal imaging donor 100 comprises a LTHC layer 108 interposed between base film 102 and the catalyst layer 106. LTHC layer 108 is incorporated as a part of thermal imaging donor 100 for radiation-induced thermal transfer to couple the energy of light radiated from a light-emitting source into the thermal transfer donor. Typically, the radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an OD at the wavelength of the imaging radiation of 0.1 to 3 or higher and preferably 0.2 to 2. Suitable radiation absorbing materials can include, for example, dyes (e.g., visible dyes, ultraviolet dyes, infrared dyes, fluorescent dyes, and radiation-polarizing dyes), pigments, metals, metal compounds, metallized films, and other suitable absorbing materials.

Suitable radiation absorbers and binders for LTHC layers are well-known in the art, and lists and references can be found, for example, in PCT/US05/38010; PCT/US05/38009; U.S. Pat. No. 6,228,555 B1; Matsuoka, M., "*Infrared Absorbing Materials*", Plenum Press, New York, 1990; and Matsuoka, M., *Absorption Spectra of Dyes for Diode Lasers*, Bunshin Publishing Co., Tokyo, 1990.

Preferred classes of near-infrared dyes for LTHC layers are cyanine compounds selected from the group consisting of: indocyanines, phthalocyanines including polysubstituted phthalocyanines and metal-containing phthalocyanines, and merocyanines. Sources of suitable infrared-absorbing dyes include H. W. Sands Corporation (Jupiter, Fla., US), American Cyanamid Co. (Wayne, N.J.), Cytec Industries (West Paterson, N.J.), Glendale Protective Technologies, Inc. (Lakeland, Fla.) and Hampford Research Inc. (Stratford, Conn.). Preferred dyes for LTHC, carrier layers and transfer layers are 3H-indolium, 2-[2-[2-chloro-3-[(1,3-dihydro-1,3, 3-trimethyl-2H-indol-2-ylidene)ethylidene]-1-cyclopenten-1-yl]ethenyl]-1,3,3-trimethyl-, salt with trifluoromethane-sulfonic acid (1:1) having CAS No. [128433-68-1] and molecular weight of about 619 grams per mole, available from Hampford Research Inc, Stratford, Conn., as TIC-5c; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1], available from H. W. Sands Corp, as SDA 4927; and indolenine dyes SDA 2860 and SDA 4733 from H. W. Sands Corp. SDA 4927 is an especially preferred dye for the LTHC layer.

An LTHC layer may include a particulate radiation absorber in a binder. Examples of suitable pigments include carbon black and graphite.

The weight percent of the radiation absorber in the layer, excluding the solvent in the calculation of weight percent, is generally from 1 wt % to 85 wt %, preferably from 3 wt % to 60 wt %, and most preferably from 5 wt % to 40 wt %, depending on the particular radiation absorber(s) and binder(s) used in the LTHC layer.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, and styrene acrylics. The % transmittance of the LTHC layer is affected by the identity and amount of the radiation-absorber and the thickness of the LTHC layer. The LTHC layer preferably exhibits radiation transmission of about 20% to about 80%, more preferably of about 40% to about 50%, at the wavelength of the imaging radiation used in the thermal transfer imaging process. When a binder is present, the weight ratio of radiation absorber to binder is generally from about 5:1 to about 1:1000 by weight, preferably about 2:1 to about 1:100 by weight. A polymeric or organic LTHC layer is coated to a thickness of 0.05 □m to 20 □m, preferably, 0.05 □m to 10 □m, and, more preferably, 0.10 □m to 5 □m.

In preferred embodiments of this invention, the LTHC layer may include a broad variety of water-soluble or water-dispersible polymeric binders with compositions as disclosed in the above referenced PCT/US05/38010 and PCT/US05/38009. Preferably, the average particle size of a water-dispersible binder in its aqueous phase is less than 0.1 micron, and more preferably less than 0.05 micron, and preferably having a narrow particle size distribution. Preferred water-soluble or water-dispersible polymeric binders for LTHC layers useful in the invention are those selected from the group: acrylic resins and hydrophilic polyesters and more preferably from sulphonated polyesters as described in the above referenced PCT/US05/38009.

Other preferred polymeric binders for LTHC layers are maleic anhydride polymers and copolymers including those comprising functionality provided by treating the maleic anhydride polymers and/or copolymers with alcohols, amines, and alkali metal hydroxides. Specific families of maleic anhydride based copolymers comprise the structure represented by formula (III)

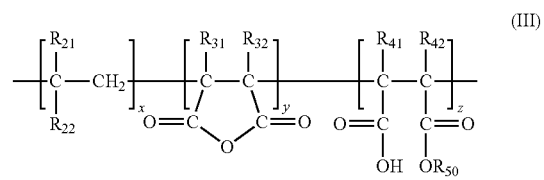

wherein x and z are any positive integer;
wherein y is zero or any positive integer;
$R_{21}$ and $R_{22}$ can be the same or different, and individually are hydrogen, alkyl, aryl, aralkyl, cycloalkyl, and halogen, provided that one of $R_{21}$ and $R_{22}$ is an aromatic group;
$R_{31}$, $R_{32}$, $R_{41}$ and $R_{42}$ are the same or different groups, which can be hydrogen or alkyl of one to about five carbon atoms; and
$R_{50}$ is functional group selected from:
  a) alkyl, aralkyl, alkyl-substituted aralkyl radicals containing from one to about twenty carbon atoms;
  b) oxyalkylated derivatives of alkyl, aralkyl, alkyl-substituted aralkyl radicals containing from about two to about four carbon atoms in each oxyalkylene group, which can be of one to about twenty repeating units;
  c) oxyalkylated derivatives of alkyl, aralkyl, alkyl-substituted aralkyl radicals containing from about two to about four carbon atoms in each oxyalkylene group, which can be of one to about six repeating units;
  d) at least one unsaturated moiety;
  e) at least one heteroatom moiety;
  f) alkaline molecules capable of forming salts selected from Li, Na, K and $NH_4^+$; and
  g) combinations thereof.

A preferred maleic anhydride polymer for LTHC layers comprises a copolymer of formula (III), wherein $R_{21}$, $R_{31}$, $R_{32}$, $R_{33}$, $R_{41}$, $R_{42}$, $R_{43}$, are individually hydrogen, $R_{22}$ is phenyl, and $R_{50}$ is 2-(n-butoxy)ethyl. A specific example of a maleic anhydride copolymer useful in LTHC layers is a styrene maleic anhydride copolymer such as SMA 1440H, a product of Sartomer Corporation, Exton, Pa.

In one embodiment of the invention, a preferred LTHC layer comprises one or more water-soluble or water-dispersible radiation-absorbing cyanine compound(s) selected from the group consisting of: indocyanines, phthalocyanines including polysubstituted phthalocyanines and metal-containing phthalocyanines, and merocyanines; and one or more water-soluble or water-dispersible polymeric binders selected from the group consisting of: acrylic resins, hydrophilic polyesters, sulphonated polyesters, and maleic anhydride homopolymers and copolymers. A most preferred LTHC layer further comprises one or more release modifiers selected from the group consisting of: quaternary ammonium cationic compounds; phosphate anionic compounds; phosphonate anionic compounds; compounds comprising from one to five ester groups and from two to ten hydroxyl groups; alkoxylated amine compounds; and combinations thereof.

Metal radiation absorbers also may be used as LTHC layers, either in the form of particles or as films deposited by various techniques such as thermal evaporation, e-beam heating and sputtering, as disclosed in U.S. Pat. No. 5,256,506. Chromium is a preferred metal for the LTHC layer 108. The preferred thickness of the metal heating layer depends on the optical absorption of the metals used. For chromium, a layer of 80-100 Angstroms is preferred. Metals forming metal oxide surfaces, for instance chromium, are preferred when electroless deposition of the patterned donor will be conducted. Non-conducting metal-based LTHC layers are preferred where electroplating of the catalytic layer will be carried out.

Preferred radiation absorbers for LTHC layers utilized herein are selected from the group consisting of: carbon black; graphite; and near infrared dyes with an absorption maxima in the range of about 600 to 1200 nm within the LTHC layer.

Catalyst Transfer Layer

The catalyst transfer layer and the patterned catalyst layer provided by thermal transfer comprises: (i) a catalyst fraction; optionally (ii) an adhesion promoter fraction; and, optionally and independently, (iii) a polymer binder fraction. The catalyst transfer layer can be a non-conducting layer or a conducting layer. The catalyst transfer layer thickness can be anywhere from about 5 nm to about 5 μm, and more preferably, about 80 nm to about 3 μm.

The catalyst fraction can be a conductive material, or a non-conductive material, depending upon the requisite properties of the patterned catalyst layer, treating conditions, method of plating, etc. The catalyst fraction comprises one or more catalyst(s) that, when applied to a substrate, can provide plating, or metal deposition, when subjected to electrolytic plating or electroless plating conditions.

Common catalysts for electroless plating are discussed in "Electroless Nickel Plating" Wolfgang Riedel, Finishing Publications Ltd, (1991), Stevenage, UK, and specifically on page 34-36. Common catalysts for electrolytic plating are conducting materials including metals and the conducting forms of carbon as discussed in "Fundamentals of Electrochemical Deposition, Second Edition", Milan Paunovic and Mordechay Schlesinger, John Wiley & Sons, Inc., (2006).

In one embodiment the catalyst transfer layer consists essentially of a catalyst fraction that is a metal film. In another embodiment the catalyst transfer layer is a metal film selected from the group consisting of: Ag, Cu, Au, Fe, Ni, Al, Pd, Pt, Ru, Rh, Os, Ir, Sn and alloys thereof. Preferably the metal film is a Ni film; and more preferably a film of about 80-100 Angstroms thick.

In one embodiment the catalyst fraction comprises one or more catalyst(s) selected from the group: (1) metal particles, including powders and colloids; (2) metal oxides; (3) organic metal complexes; (4) metal salts; (5) ceramics and other non-conductor powders coated with metal salts, metal oxides, metal complexes, metal or carbon; and (6) carbon in all conductive forms; each metal of (1) to (5) selected from the group consisting of: Ag, Cu, Au, Fe, Ni, Al, Pd, Pt, Ru, Rh, Os, Ir, Sn and alloys thereof.

Examples of metal alloys useful as catalysts are stainless, carbon, low- and high-alloy steel; and alloys of nickel, copper, aluminum, magnesium, beryllium, titanium, zinc, molybdenum, tungsten, tin, lead, silver and manganese. A comprehensive list of substrates can be found in Gawrilov, G. G.: Chemical (Electroless) Nickel Plating, Portcullis Press, Redhill, UK 1979; and Simon, H.: Galvanotechnik, 74 (1983) pp. 776-771.

In one embodiment, the catalyst is a conductive metal oxide selected from doped and undoped metal oxide particles including transparent conductive oxides such as indium-tin-oxide (ITO), antimony-tin-oxide (ATO), tin oxide, fluorine-doped tin oxide, zinc oxide, aluminum-doped zinc oxide (AZO), zinc tin oxide (ZTO); and alloys thereof.

In one embodiment the catalyst fraction comprises metal particles having an average longest dimension of about 5 nm to about 1500 nm.

In another embodiment the catalyst fraction comprises one or more organic metal complex(es). Examples of the organic metal complexes that can be used include acetylacetonatoplatinum, cis-bis(benzonitrile)dichloroplatinum, acetylacetonatopalladium, bis(benzylideneacetone)palladium, bis (benzonitrile)dichloropalladium, bis[1,2-bis(diphenylphosphino)ethane]palladium, hexafluoroacetylacetonatopalladium, etc.

In another embodiment the catalyst fraction comprises one or more metal salts, for instance, palladium acetate, palladium chloride and sodium tetrachloropalladate(II).

Platinum colloidal suspensions useful as catalysts can be prepared from chloroplatinic acid (hydrogen hexachloroplatinate) as disclosed in Shah, P. et. al, Langmuir 1999, 15, 1584-1587. A commonly used palladium colloid is tetraoctadecylammonium bromide-stabilized palladium colloid as disclosed in Hidber, P. C. et. al., Langmuir 1996, 12, 5209-5215.

Adhesion Promoters

In various embodiments the catalyst transfer layer has an adhesion promoter that is useful in improving the bonding of the patterned catalyst layer to the base film after thermal transfer is completed. The adhesion promoter also tends to improve the bonding of the patterned metal layer on the patterned substrate after plating is completed. With certain adhesion promoters, and typically with the glass frit and metal oxides, additional treatment such as heating or annealing is required to realize optimal adhesion of the patterned catalyst layer and patterned metal layer to the substrate. In one embodiment the catalyst layer comprises an adhesion promoter fraction of about 0.5 to about 10 wt %, and preferably about 1.0 to about 4.0 wt %, based on the total weight of the catalyst layer.

Glass frit useful as an adhesion promoter usually has a softening point of about 200 to 700° C., preferably about 350 to 700° C., more preferably from 400 to 620° C. The glass frit useful as an adhesion promoter typically has an average particle size of about 100 nm to about 5 microns; and preferably about 100 nm to about 800 nm. However, glass frit with an average particle size less than 100 nm can be used as an adhesion promoter, if so desired. The glass frit is suitably selected from conventional glass frits having a softening point in the above range and then baked. Examples of the conventional glass frits include a glass frit with a low softening point in the above range comprising the oxides of the elements Al, Si, B, Na, Li, Ca, Mg, Mo, Ba, Bi, Zn, Zr, Ti, W, Sn, Sr, Co, Ru, V, Ta, W, Mn, Cu, Ag, Ce, Cd, and P. Specific glasses include $PbO$—$SiO_2$—$B_2O_3$ glass, $PbO$—$SiO_2$—$B_2O_3$—$ZnO$ glass, $PbO$—$SiO_2$—$B_2O_3$—$Al_2O_3$—$ZnO$ glass, $B_2O_3$—$SiO_2$—$B_2O_3$ glass, $ZnO$—$SiO_2$—$B_2O_3$ glass, and the like. These materials can be used independently or in combination as adhesion promoters. In one embodiment the adhesion promoter fraction is 0.5 to about 10 wt %, preferably 1.0 to about 4.0 wt %, based on the total weight of the catalyst layer, when glass frit is used.

Metal oxides useful as adhesion promoters can be, for example, $Na_2O$, $CaO$. $CdO$, $BaO$, $ZrO$, $ZnO$, $MgO$, $CoO$, $NiO$, $FeO$, $MnO$, $PbO$ and combinations thereof; and in combination with $SiO_2$.

Metal hydroxides and alkoxides useful as adhesion promoters include those of Group IIIa thru VIIIa, Ib, IIb, IIIb, and IVb of the Periodic Table and the lanthanides. Specific adhesion promoters are metal hydroxides and alkoxides of metals selected from the group consisting of Ti, Zr, Mn, Fe, Co, Ni, Cu, Zn, Al, and B. Preferred metal hydroxides and alkoxides are those of Ti and Zr. Specific metal alkoxide adhesion promoters are titanate and zirconate orthoesters and chelates including compounds of the formula (I), (II) and (III):

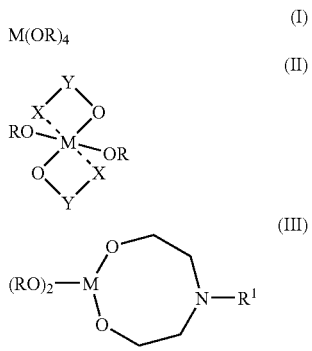

wherein
M is Ti or Zr;
R is a monovalent $C_1$-$C_8$ linear or branched alkyl;
Y is a divalent radical selected from —CH(CH$_3$)—, —C(CH$_3$)=CH$_2$—, or —CH$_2$CH$_2$—;
X is selected from OH, —N(R$^1$)$_2$, —C(O)OR$^3$, —C(O)R$^3$, —CO$_2$$^-$A$^+$; wherein
R$^1$ is a —CH$_3$ or $C_2$-$C_4$ linear or branched alkyl, optionally substituted with a hydroxyl or interrupted with an ether oxygen; provided that no more than one heteroatom is bonded to any one carbon atom;
R$^3$ is $C_1$-$C_4$ linear or branched alkyl;
A$^+$ is selected from NH$_4$$^+$, Li$^+$, Na$^+$, or K$^+$.

In one embodiment the adhesion promoter fraction is about 0.5 to about 20 wt %, preferably about 0.5 to about 5.0 wt %, based on the total weight of the catalyst layer, when metal hydroxides and alkoxides are used as the adhesion promoter fraction. Commercially available titanate and zirconate orthoesters and chelates useful as adhesion promoters are the TYZOR® organic titanates and zirconates available from E.I. DuPont de Nemours, Inc., Wilmington, Del. Specific organic zirconates are TYZOR® 212, 217, TEAZ, and Cl-24 organic zirconates. Specific organic titanates are TYZOR® TE and LA organic titanates.

Silicate hydroxides and alkoxides useful as adhesion promoters include those of formula (IV)

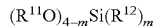

wherein
m is an integer equal to 0, 1, 2, or 3;
R$^{11}$ is hydrogen or a $C_1$-$C_6$ linear or branched alkyl; and
R$^{12}$ is a $C_1$-$C_{12}$ linear or branched alkyl, optionally having 1 or 2 carbon-carbon double bonds, and optionally substituted by —NH$_2$; —CN, —NCO, or —OC(O)—CR$^{13}$=CH$_2$; wherein R$^{13}$ is hydrogen or $C_1$-$C_4$ alkyl. Specific examples of silicate alkoxides useful in the invention are tetramethoxysilane; tetraethoxysilane, tetrapropoxysilane, tetrabutoxysilane, trimethoxymethylsilane, triethoxymethylsilane, trimethoxyvinylsilane, triethoxyvinylsilane, 3-aminopropyl trimethoxysilane, 3-aminopropyl triethoxysilane, 3-methacryloyloxypropyl trimethoxysilane, 3-methacryloyloxypropyl triethoxysilane, 3-isocyanatopropyl trimethoxysilane, 3-isocyanatopropyl triethoxysilane, and 3-cyanopropyl trimethoxysilane.

In one embodiment the adhesion promoter fraction is about 0.5 to about 20 wt %, preferably about 0.5 to about 5.0 wt %, based on the total weight of the catalyst layer, when silicate hydroxides and alkoxides are used as the adhesion promoter fraction.

Organic polyols useful as adhesion promoters include organic polyols having two or more hydroxyl groups per molecule and having hydroxyl equivalent weights of about 30 to about 200 g/equivalent, preferably about 30 to about 100 g/equivalent, and more preferably about 30 to about 60 g/equivalent. In one more specific embodiment the organic binders useful as adhesion promoters are organic polyols selected from the group consisting of $C_2$-$C_{60}$ linear or branched alkyl; $C_5$-$C_{60}$ alicyclic; and $C_6$-$C_{60}$ radicals consisting of a combination of linear or branched alkyl and alicyclic radicals; each optionally interrupted by one or more —O—, —S—, —OC(O)—, and —NR$^{11}$C(O)—, wherein R$^{11}$ is hydrogen or a $C_1$-$C_6$ linear or branched alkyl. In one embodiment, the adhesion promoter fraction can contain at least one polyol selected from ethylene glycol, glycol derivatives, glycerol and glycerol derivatives, pentaerythritol (CAS [115-77-5]), trimethylolpropane (CAS [77-99-6]), dipentaerythritol (CAS [126-58-9]), ditrimethylolpropane (CAS [23235-61-2]), sorbitol (CAS 50-70-4]), sorbitan monooleate (CAS [1338-43-8]), sorbitan monolaurate (CAS [1338-39-2]), 2-butyl 2-ethyl 1,3-propanediol (CAS 115-84-4]), 2-methyl 1,3-propanediol (CAS [2163-42-0]), neopentyl glycol (CAS [126-30-7]), 1,4-butanediol (CAS [110-63-4]), and 1,6-hexanediol (CAS [629-11-8]).

In one embodiment, organic binders useful as the adhesion promoter fraction can contain at least one of an ethoxylated or propoxylated compound such as ethoxylated pentaerythritol (CAS [42503-43-7]), propoxylated pentaerythritol (CAS [9051-49-4]), ethoxylated trimethylol propane adducts, e.g. those equivalent to ethoxylation with 3-8 moles of ethylene oxide per mole ingredient (CAS [50586-59-9]), ethoxylated trimethylol propane propylene oxide adducts equivalent to propylene oxide at 3 to 9 mole equivalents per mole ingredient (CAS [25723-16-4]), ethoxylated sorbitan monooleate equivalent to ethylene oxide adduct with from 20 to 80 ethylene oxide moles per mole ingredient (CAS [9005-65-6]), and ethoxylated sorbitan monolaurate (CAS [9005-64-5]).

In one embodiment, the organic binders useful as adhesion promoter fraction can contain a hyperbranched polyol, for example a dendritic hyperbranched polyol, a hyperbranched dendritic polyether or polyester, a hyperbranched polyether or polyester, arborols, dendritic or cascade super-molecules and their hyperbranched cousins, or a dendritic macromolecule of the polyester type having one or more reactive hydroxyl groups. Such hyperbranched polyols are described for example in U.S. Pat. No. 5,418,301 of Hult, et al. assigned to Perstorp AB titled "Dendritic Macromolecule and Process for Preparation Thereof", U.S. Pat. No. 5,663,247 of Sorensen et al. assigned to Perstorp AB titled "Hyperbranched Macromolecule from Epoxide Nucleus and Hydroxy-functional Carboxylic Acid Chain Extenders", U.S. Pat. No. 6,617,418 of Magnusson et al. assigned to Perstorp AB titled "Hyperbranched Dendritic Polyether and Process for Manufacture Thereof", and U.S. Pat. No. 6,765,082 of Sunder et al. assigned to Bayer Aktiengesellschaft titled "Method for Producing Highly-Branched Glycidol-based Polyols". Commercially available hyperbranched polyol products include those of Perstorp, for example Boltorn H20, H2003, H2004, H30, H40, P1000, and H311 with respective average OH functionality per molecule of 16, 12, 6.4, 32, 64, 14, and unspecified, and respective average relative molecular mass of 2100, 2500, 3200, 3500, 5400, 1500, and unspecified. Examples of hyperbranched polyols include polyether structure (V) and polyester structure (VI) based upon pentaerythritol:

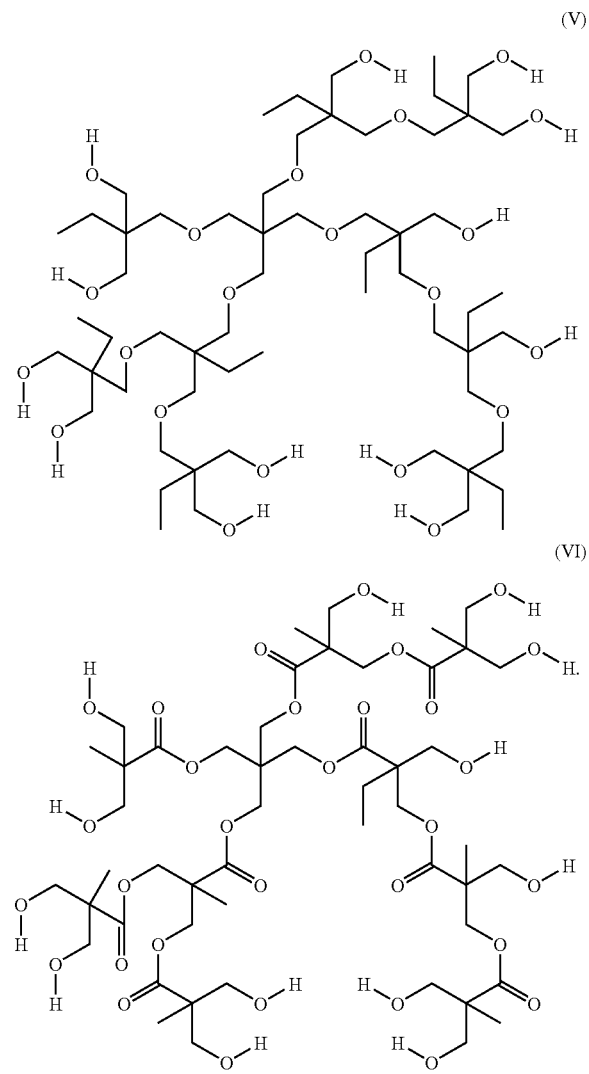

In one embodiment, the organic binders useful as adhesion promoter fraction can contain branched alkyl interrupted by —O—, —S—, —OC(O)—, and —NR$^{11}$C(O)—. Specific examples of polyols interrupted by —OC(O)—, are listed above. A specific example of an polyol interrupted by —NR$^{11}$C(O)—, referred to amide polyols, is formula (VII), commercially available as PRIMID® XL552 polyol from EMS Chemie, Domat/Ems, Switzerland.

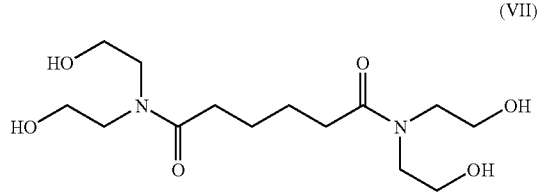

In one embodiment the adhesion promoter fraction is about 0.5 to about 20 wt %, preferably about 0.5 to about 5.0 wt %, based on the total weight of the catalyst layer, when organic polyols are used as the adhesion promoter fraction.

Polymer Binder Fraction

The catalyst transfer layer, optionally, and independently of whether an adhesion promoter is present, has a polymer binder fraction. In one embodiment the catalyst transfer layer has a polymer binder fraction and, preferably, the polymer binder is selected from the group consisting of: one or more conducting (co)polymers/(co)oligomers selected from the group consisting of: polyaniline, polythiophene, polypyrrole, polyheteroaromatic vinylenes, and their derivatives; one or more non-conducting (co)polymers/(co)oligomers selected from the group consisting of: acrylic, styreneic and styrenic-acrylic latexes; solution-based acrylic, styrenic and styrenic-acrylic polymers; and combinations thereof; copolymers of ethylene with one or more monomers selected from the group consisting of: alkyl (meth)acrylate(s) wherein the alkyl group is a C1 to C18 linear or branched chain alkyl, norbornene, vinyl acetate, carbon monoxide, (meth)acrylic acid; and polyvinylacetate and its copolymers; vinyl (co)polymer(s) or (co)oligomer(s) comprising repeat units selected from the group consisting of: vinyl acetate, vinyl chloride, vinylbutyraldehyde, vinyl alcohol and vinylpyrrolidone; heteroatom-substituted styrenic polymers selected from the group consisting of: poly(4-vinyl)pyridine, poly(4-hydroxy)styrene, partially hydrogenated poly(4-hydroxy)styrene, and copolymers thereof; phenol-aldehyde (co)polymers and (co)oligomers and combinations thereof.

In one embodiment, the polymer binder fraction comprises polymers selected from the group consisting of: acrylic and styrenic-acrylic latexes and solution-based acrylic and styrenic-acrylic (co)polymers including random and graft copolymers; and combinations thereof; copolymers of ethylene with one or more monomers selected from the group consisting of: (meth)acrylates, vinyl acetate, carbon monoxide and (meth)acrylic acid; polyvinylacetate and its copolymers; and polyvinylpyrrolidone and its copolymers including polyvinylpyrrolidone-co-vinyl acetate. Preferably the latexes have an average particle size of less than about 150 nm, more preferably, less than about 100 nm.

Preferred solution-based acrylic, styrenic and styrenic-acrylic polymers have a $M_w$ of less than about 100,000, preferably less than 50,000, and more preferably less than 30,000. In one embodiment the polymer binder fraction has an acid number of about 10 to about 300. The acid number is the milli-equivalents of KOH per gram, as determined by standard titration techniques, needed to neutralize the acid functionality in the latex or solution polymers. The acid functionality is generally incorporated into the acrylic and styrenic-acrylic polymers by copolymerization of ethylenically unsaturated carboxylic acids, such as acrylic acid, methacrylic acid, etc.

Commercial examples of solution-based acrylic and styrenic acrylic polymers useful as polymer binders include Carboset® GA2300 (Noveon), Joncryl® 63 (Johnson Polymer), and Elvacite® 2028 (Lucite International). Commercial examples of acrylic and styrenic acrylic latexes useful as polymer binders include Joncryl® 95, 538 and 1915 (co) polymers (Johnson Polymer). Methods for synthesizing suitable latex polymers have been reported in WO 03/099574.

In one embodiment the catalyst layer and patterned catalyst layer comprises about 1.0 to 99 wt % catalyst fraction; about 0.5 to 10 wt % adhesion promoter fraction; and about 0.5 to 98.5 wt % polymer binder fraction.

Another embodiment of the invention is a method wherein the thermal transfer donor comprises a base film and a catalyst layer (A), and said catalyst layer (A) comprises:
(i) about 1.0 to about 99 wt % of a catalyst fraction, based on the total weight of the catalyst layer, said catalyst fraction comprising metal particles selected from Ag, Cu, and alloys thereof;
(ii) about 0.5 to about 10 wt % of an adhesion promotor fraction selected from glass frit; and metal hydroxides and alkoxides;
(iii) about 0.5 to about 98.5 wt % of a polymer binder.

Another embodiment is the method as described above wherein the catalyst layer (A) consists essentially of components (i), (ii), and (iii), as described above; wherein the polymer binder is selected from the group consisting of: one or more conducting (co)polymers/(co)oligomers selected from the group consisting of: polyaniline, polythiophene, polypyrrole, polyheteroaromatic vinylenes, and their derivatives; one or more non-conducting (co)polymers/(co)oligomers selected from the group consisting of: acrylic, styreneic and styrenic-acrylic latexes; solution-based acrylic, styrenic and styrenic-acrylic polymers; and combinations thereof; copolymers of ethylene with one or more monomers selected from the group consisting of: alkyl(meth)acrylate(s) wherein the alkyl group is a C1 to C18 linear or branched chain alkyl, norbornene, vinyl acetate, carbon monoxide, (meth)acrylic acid; and polyvinylacetate and its copolymers; vinyl (co)polymer(s) or (co)oligomer(s) comprising repeat units selected from the group consisting of: vinyl acetate, vinyl chloride, vinylbutyraldehyde, vinyl alcohol and vinylpyrrolidone; heteroatom-substituted styrenic polymers selected from the group consisting of: poly(4-vinyl)pyridine, poly(4-hydroxy)styrene, partially hydrogenated poly(4-hydroxy) styrene, and copolymers thereof; phenol-aldehyde (co)polymers and (co)oligomers and combinations thereof.

Another embodiment of the invention is a method wherein the thermal transfer donor comprises a base film and a catalyst transfer layer (B) comprising:
(i) about 1.0 to about 99 wt % of a catalyst fraction, based on the total weight of the catalyst layer, said catalyst fraction comprising metal particles selected from Ag, Cu, and alloys thereof;
(iii) about 1.0 to about 99 wt % of a polymer binder; and
wherein the adhesion promoter layer comprises material selected from glass frit; and metal hydroxides and alkoxides.

Another embodiment includes a catalyst transfer layer comprising an adhesion promoter fraction comprising organic polyols and a polymer binder fraction comprising acrylic and styrenic-acrylic latexes and solution-based acrylic and styrenic-acrylic (co)polymers having an acid number of about 10 to about 300. Preferably the organic polyols are amide polyols, as discussed above.

Antireflective Agent Fraction

When the patterned metal layer provided by the invention is to be used in display applications, for instance, as the front filter for a display device, the catalyst layer, optionally and preferably, has an antireflective agent fraction designed to reduce the reflectivity of the catalyst transfer layer, and the metal layer plated onto it. In specific embodiments the antireflective agent is a black pigment selected from the group consisting of ruthenium, manganese, nickel, chromium, iron, cobalt, copper, and alloys thereof; their oxides; and mixtures thereof. Preferred antireflective agents include $RuO_2$, $Cr_3O_4$, $Co_2O_3$, and Ni. Examples of nonconductive antireflective agents are ceramic-based blacks including Fe—Co chromite, Cr—Fe—Ni spinel, and Cu-chromite. When the catalyst transfer layer contains an antireflective agent fraction, the conductivity of the catalyst layer often decreases. Therefore, it is desirable to control the amount of an antireflective agent. In another embodiment the antireflective agent can be a reactive precursor, which upon treatment provides the antireflective agent. Examples of reactive precursors to antireflective agents include metals such as ruthenium, manganese, nickel, chromium, iron, cobalt, or copper; alkoxide derivatives, complexes with β-diketones, complexes with β-keto acid esters, and organic carboxylate esters of these metals. They are converted to the corresponding oxides on baking to exhibit black color and antireflective properties. When the metal as such is used as a reactive precursor to the antireflective agent, it may be different from the metal powder used as the catalyst fraction, or one metal may have dual functions. For example, when copper powder is used as the catalyst fraction, a part of the copper powder may become black copper oxide on baking.

Preparation of the Thermal Imaging Donor

The thermal imaging donor comprising a catalyst transfer layer may be prepared by applying a fluid dispersion of the catalyst transfer layer composition onto the surface of a base film, or the LTHC layer, if present, and volatizing the carrier fluid. Applying the fluid dispersion can be accomplished by any method that gives a uniform layer, or if desired, a patterned or nonuniform catalyst transfer layer. Coating, including rod coating and spin-coating, spraying, printing, blading or knifing can be used. Coating and spraying are preferred methods for applying the fluid dispersion to provide uniform catalyst transfer layers. The carrier fluid is allowed to evaporate to provide the catalyst transfer layer or the layer can be dried by any conventional method of drying including applying heat and/or vacuum.

Receiver

The thermal imaging method requires the presence of a thermal imaging receiver to receive the material removed from the patterned catalyst layer. The purpose of the receiver is to collect debris removed from the imaged portion of the catalyst transfer layer. The receiver may comprise additional layers, for instance, adhesive layers used in gathering debris. The receiver comprises a base layer 202. The receiver base layer 202 is a dimensionally stable sheet material as defined for the base film of the thermal transfer donor. Additionally, the receiver base layer can be an opaque material, such as polyethylene terephthalate filled with a white pigment such as titanium dioxide; ivory paper; or synthetic paper, such as Tyvek® spunbonded polyolefin. The base layer material can also be glass. Preferred base layers for receivers are polyethylene terephthalate, polyethylene naphthalate, polyimide, for instance Kapton® polyamide, and glass.

Contacting

The thermal transfer donor is contacted with a thermal imaging receiver. The contacting is made with the catalyst transfer layer of the donor. By "contacting" is meant that the donor is in close proximity, preferably within several microns of the receiver. The receiver may be off-set from the donor by, for example, previously printed layers, fibers or particles that act as spacers to provide a controlled gap between donor and receiver. Vacuum and/or pressure can be used to hold the donor element 100 and the receiver element 200 together. As one alternative, the donor element 100 and the receiver element 200 can be held together by fusion of layers at the periphery of the assembly. As another alternative, the donor element 100 and receiver element 200 can be taped together and taped to the imaging apparatus. A pin/clamping system can also be used. As yet another alternative, the donor element can be laminated to the receiver element. If the donor element 100 and the receiver element 200 are flexible, the assembly can be conveniently mounted on a drum to facilitate laser imaging.

Removing

Figure 2:
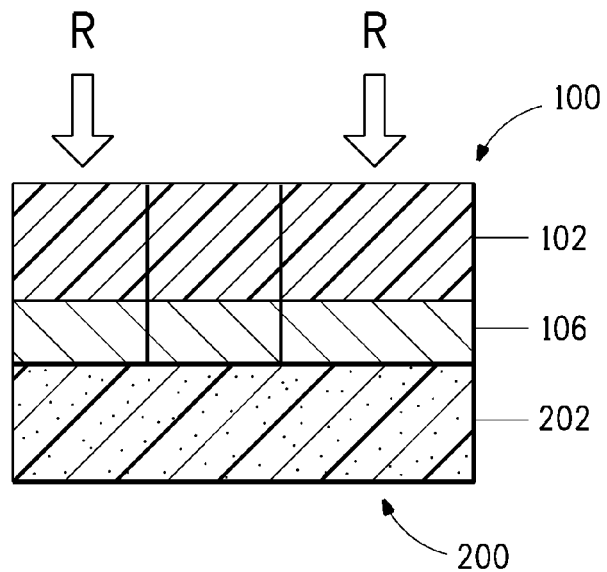
FIG. 2 illustrates the laser-mediated imaging process for preparing patterned substrates.

Thermal transfer can be achieved by a laser-mediated transfer process as illustrated in FIG. 2. In one embodiment, the assembly of the donor 100 and the receiver 200 is selectively exposed to heat, which is preferably in the form of laser radiation (R), in an exposure pattern of the image of the desired pattern to be formed on the receiver. The laser radiation or laser beam (R) is focused about at the interface between the catalyst transfer layer 106 and LTHC layer 108, if present, otherwise it is focused about at the interface between 106 and base film 102. Sufficient radiation is applied to achieve removal of at least a portion of the catalyst layer from the donor. The_term "negative imaging" refers to the exposing the thermal transfer donor, typically with an IR light beam, to provide at least partial removal of the catalyst transfer layer in the exposed regions. The unexposed regions, resulting from this negative imaging process, have the patterned catalyst layer undisturbed and remain part of the exposed donor.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102, that is, the side not containing the catalyst transfer layer. Laser radiation preferably is provided at a laser fluence of up to about 600 mJ/cm$^2$, and more preferably about 75-440 mJ/cm$^2$. Lasers with an operating wavelength of about 350 nm to about 1500 nm are preferred. Particularly advantageous are diode lasers, for example those emitting in the region of about 750 to about 870 nm and up to 1200 nm, which offer a substantial advantage in terms of their small size, low cost, stability, reliability, ruggedness and ease of modulation. Such lasers are available from, for example, Spectra Diode Laboratories (San Jose, Calif.). One device used for applying an image to the receiver is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Suitable lasers for thermal imaging include, for example, high power (>90 mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more.

The thermal imaging method requires at least a portion of the catalyst transfer layer be removed from the donor by thermal transfer to provide a patterned catalyst layer on the donor. The patterned catalyst layer on the donor becomes, upon removal of the receiver, the patterned substrate, required for the plating step.

Figure 3:
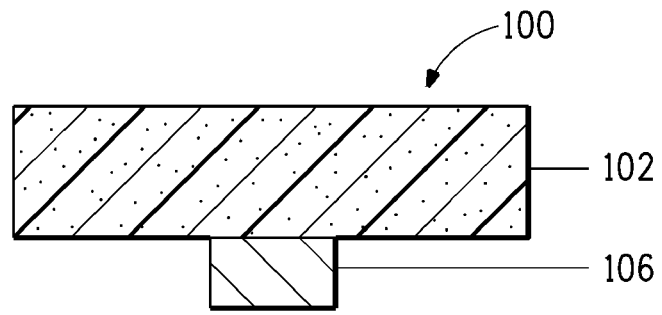
FIG. 3 illustrates thermal transfer donor after removal of portions of the patterned catalyst layer.

After exposure, the donor element 100 and the receiver element 200 are separated, leaving the unexposed portions of the catalyst transfer layer 106 on the donor element 100 as illustrated in FIG. 3. Usually the separation of the donor and receiver is achieved by simply peeling the two elements apart. This generally requires very little peel force and is accomplished by simply separating the donor element from the receiver element. This can be done using any conventional separation technique and can be manual or automatic.

Usually the removed portions of the transfer layers correspond to those portions of the transfer layers exposed to laser radiation. In some instances, depending upon the nature of the donor and receiver elements and the transfer processing parameters, when the donor element 100 and the receiver element 200 are separated, the donor element may include both exposed portions and non-exposed portions of one or more transfer layers. A process for enhancing the resolution of a pattern on a substrate comprising an exposed portion and a non-exposed portion of one or more thermal transfer layers on a surface of the substrate comprises: (a) contacting said surface of the patterned substrate with an adhesive surface to provide a temporary laminate; and (b) removing said adhesive surface from the temporary laminate to provide a patterned substrate with a surface substantially free of said exposed portion of one or more transfer layers. Suitable adhesive surfaces for performing the process are commercial adhesive tapes, for instance, those Scotch® brand tapes available from 3M company. Tacky rollers, for instance, a medium tack roller available in the form of a Dust Removal System-1 (red) from SDI (Systems Division, Inc., Irvine, Calif. 92618-2005) are a suitable adhesive surface for the process. Chrome films, used as LTHC layers described above, also make useful low tack adhesive layers for removing non-exposed portions of the transfer layers under very gentle conditions.

Another embodiment of the thermal imaging method further comprises:

(e) heating the patterned substrate to an anneal temperature for an anneal period to provide the annealed patterned substrate; and said plating metal, comprises plating said annealed patterned substrate. This aspect of the thermal imaging method is useful in fixing the adhesion promoter, present in or adjacent the patterned catalyst layer, to base film. Annealing of the patterned substrate is particularly useful in processes wherein the patterned metal layer provided by the plating step is intended to remain bonded to base film. Glass frit is typically heated to a softening or melting temperature as disclosed above. Other adhesion promoters such as the polyols combined with polycarboxylates, metal hydroxides and alkoxides, can also give improved adhesion to substrates upon heating to an anneal temperature. For polymer base films, the anneal temperature is usually between 80 and 150° C.; for glass base films, the anneal temperature can be higher, typically 150 to 550° C. depending upon whether polymer binders are present in the patterned catalyst layer and the particular nature of the adhesion promoter.

Plating

The method further comprises plating metal onto said patterned substrate, to provide the patterned metal layer in connectivity with the patterned catalyst layer. Herein the term "plating" refers to any method providing selective metal deposition onto the patterned catalyst layer, as a result of the presence of the patterned catalyst layer. Wet plating is preferable since the metal layer can be selectively formed on the patterned catalyst layer. Wet plating includes electroless plating and electrolytic plating, or a combination thereof, and is adequately selected depending on the required conductivity of the patterned catalyst layer. Electrolytic plating is a galvanic process requiring an electric current to be passed through an electrolyte solution containing metal ions capable of being reduced. The most common electrolytic plating system involves a conducting substrate as an anode (the substrate undergoing plating); a chemical solution containing an ionic form of the metal to be plated; and a cathode where electrons are being supplied to produce a film of metal. Electroless plating is a non-galvanic plating that involves several simultaneous chemical reactions in an aqueous solution, which occur without the use of external electrical power. Electroless plating systems have in common a metal ion capable of being reduced to a metal; and a chemical reducing agent capable of delivering electrons to the metal ion. The most common electroless plating method is electroless nickel plating that uses sodium hypophosphite as the reducing agent and nickel (II) ions as the metal ion. The two plating processes may be employed in combination. When the patterned catalyst layer is conductive, the electroplating can be applied from the beginning. When conductivity of the pattern is insufficient, a first conductive layer having a small thickness is formed by electroless plating; and then, a second conductive layer is formed by electroplating; to from the patterned metal layer. One embodiment of the invention is wherein the plating metal is selected from the group consisting of Ni, Cu, Fe, Cr, Sn, Mn, Mo, Ag, Au, W, Zn, and alloys thereof. Preferred plating metals are Ni and Cu.

The plating process may further include any treatment processes that are known in the art of plating that may be beneficial in the overall deposition of metal onto the patterned catalyst layer. For instance, the patterned substrates may be pre-treated with sensitizers, cleaning agents, and the like before the deposition of metal.

The patterned metal layer provided by the plating process may be a single layer or a multilayer having two, three or more sub-layers. The thickness of the patterned metal layer is usually from about 0.1 to about 20 microns, preferably from about 0.1 to about 5 microns. In one embodiment the patterned metal layer has a resistance of about 5 Ohms per square or less as measured using the 4 probe resistance function of a HP 3478A multimeter. Preferably the patterned metal layer is in the form of a geometric pattern of lines forming a mesh having pitches in the range of 150 to 500 micron, and a line width of about 10 to 80 microns.

Darkening Agent

In another embodiment, the method further comprises treating the patterned metal layer with a darkening agent to reduce reflectivity of the metal layer, as evidenced by visual examination. The darkening agent can be an oxidizing agent that oxidizes metals like Cu, Ni and alloys thereof. For instance, EBONOL®-C oxidizer, is a proprietary blackening agent for copper and copper alloys marketed by Cookson Electronics, Providence, R.I.; that is useful as a darkening agent in the treating of the patterned metal layer.

Figure 4:
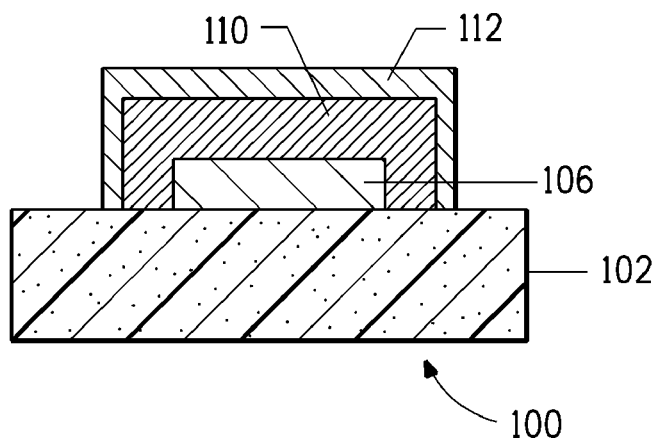
FIG. 4 illustrates a patterned metal layer provided by one embodiment.

FIG. 4 is a side-view of one embodiment encompassing a donor 100 including a donor base film 102, a patterned catalyst layer 106, a patterned metal layer 110, and a darkened patterned metal layer 112.

Electronic Device

The method is useful in the manufacture of a variety of electronic devices that require patterned conducting layers; especially those mounted on flexible substrates. Examples of electronic devices that can be made by the method include a touchpad sensor and electromagnetic interference (EMI) shield.

A touchpad sensor comprising a patterned metal layer as described above further comprises a dielectric layer, typically an organic polymer having suitable dielectric properties. In one embodiment the touchpad sensor comprises a first base layer with a first patterned metal layer; a second base layer with a second patterned metal layer; and a dielectric layer deposed between the first and second patterned metal layers. In another embodiment the touchpad sensor comprises a first base layer, having two opposing surfaces, a patterned metal layer deposed on each of the two opposing surfaces; and a dielectric layer on top of each of the patterned metal layers.

The various embodiments of the method have several advantages over other methods for producing metal patterns, including precise digital control of the pattern being formed; the capability to prepare mesh having fine lines, down to 10 micron line-width. In addition the steps of manufacturing the patterned catalyst layer are dry steps, that is, they do not require the use of solvents, etchants, and masks, typically used in conventional photolithography methods. The only step requiring conventional "wet" processing is the plating step. Thus, the overall method may be more environmentally friendly than conventional methods used in making metal mesh.

Materials, Equipment and Methods

Unless otherwise indicated, chemicals were used as received without further purification. Polymers, plasticizers, IR dyes, and surfactants were obtained from the sources listed in the specification or purchased from Aldrich. Pigments such as carbon black dispersions were obtained from Penn Color, Inc., Doylestown, Pa.

A Creo Trendsetter® 800 (Creo/Kodak, Vancouver, Canada) was utilized for imaging to flexible substrates. The Creo Trendsetter® 800 is a modified drum-type imager utilizing a modified Thermal 1.7 Head with a 12.5 watt maximum average operating power at a wavelength of 830 nm with 5080 dpi resolution. The 800 Trendsetter was operated in a controlled temperature/humidity environment with an average temperature of ~68° C. and an average relative humidity of ~40-50%. For each printing experiment, a section of thermal imaging receiver was positioned on the drum. The thermal transfer donor was loaded so that the side of the donor element coated with the catalyst transfer layer was facing the free side of the receiver. Imaging assemblages were exposed from the back-side through the donor film base. Films were mounted using vacuum hold down to a standard plastic or metal carrier plate clamped mechanically to the drum. In some experiments utilizing the Creo Trendsetter® 800 thermal platesetter, a nonstandard drum with vacuum holes machined directly onto the drum to match common donor and receiver sizes was used as a replacement for the standard drum/carrier plate assemblage. Contact between the donor and receiver was established by about 600 mm of Hg vacuum pressure. Laser output was under computer control to build up the desired image pattern. Laser power and drum speed were controllable and were adjusted in an iterative fashion to optimize image quality as judged by visual inspection of the patterned catalyst layer on the donor surface.

Characterization Methods

Resistivity—Resistivity was measured using the four probe resistance function of a HP 3478A multimeter (Hewlett-Packard). Typically a square of mesh ~15 mm on a side was measured.

Thickness—Thickness of the layers was determined using a KLA Tencor P-15 profiler.

TABLE 1

Glossary of Materials

| Descriptor | Generic name/structure | Source |
|---|---|---|
| Amertech Polyester Clear ® | polyester binder, 30% aqueous solution | American Inks and Coatings Corp; Valley Forge; PA |
| BYK ®-025 | Silicone defoamer | BYK-Chemie USA, Inc., Wallingford, CT |
| CARBOSET GA 2300 | Styrenic-acrylic polymer | Noveon, Cleveland, Ohio |
| DEGDB | di(ethylenegylcol)dibenzoate | Aldrich Chemical Co., Milwaukee, WI |
| ELVACITE ® 2028 | acrylic polymer | Lucite International, |
| Cymel ™ 350 | Melamine formaldehyde resin | Cytec Industries Inc. West Paterson, NJ |
| MELINEX ® ST504 | polyester film | DuPont Teijin Film, Hopewell, VA |
| SDA 4927 | near-IR dye | H.W. Sands Co., Jupiter, FL |
| TegoWet ™ 251(4) | Polyether modified polysiloxane copolymer | Degussa, Hopewell, Va |
| ZONYL FSA | Anionic fluoro surfactant | E.I. DuPont de Nemours, Inc., Wilmington, DE |

Organic LTHC Layer. The organic LTHC layer was prepared as reported in Formulation L of the Examples of PCT/US05/38009, referenced above:

A LTHC coating formulation was prepared from the following materials: (i) demineralised water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; Pa.): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound.]; (vii) crosslinker Cymel™ 350 (a highly methylated, monomeric melamine formaldehyde resin, Cytec Industries Inc. West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. There was no need to filter this formulation. The formulation was applied in an in-line coating technique as follows: A PET base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 μm. A direct gravure coating system was used to apply the coatings to the film web. A 60QCH gravure roll (supplied by Pamarco) rotates through the solution, taking solution onto the gravure roll surface. The gravure roll rotates in the opposite direction to the film web and applies the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film is then wound onto a roll. The total thickness of the final film was 50 μm; the dry thickness of the transfer-assist coating layer is of 0.07 μm. The PET base film contained Solvent Green 28 dye to give a final dye concentration of typically 0.2% to 0.5% by weight in the polymer of the base film. The base film containing the Solvent Green 28 dye (0.40% by weight) had an absorbance of 1.2 at 670 nm, and an absorbance of <0.08 at 830 nm. The donor substrate will herein be referred to as: Organic LTHC Green PET donor substrate.

Donor Comprising a Base Film and Ni Metal Layer

A base film of polyethylene terephthalate (PET, 50 microns thick) was coated with nickel metal in a vacuum deposition chamber by CP Films of Martinsville, Va. Metallization was carried out on PET films with and without light attenuating agents (670 nm absorbers). The nickel layer was coated at 50% T. In the examples, this donor film will be referred to as: 50%T Ni PET donor for the metallized film without light attenuating agents.

Coating of transfer and other layers onto donor and receiver elements was carried out utilizing stainless steel wrapped and formed 0.5 inch diameter coating rods purchased from R.D. Specialties, Inc. (RDS; Webster, N.Y.) and chrome-plated stainless steel formed 0.625 inch diameter rods with a CN profile purchased from Buschman Corporation (Cleveland, Ohio). The donor free surface was cleaned with a pressurized nitrogen stream immediately prior to coating to rid the surface of particle contamination. The coatings were drawn by hand on a smooth glass surface or machine-coated utilizing either a WaterProof® Color Versatility coating system (CV coater) manufactured by DuPont De Nemours Inc. (Wilmington, Del.) or a slot-die coater.

EXAMPLE 1

A 50% T Ni PET donor (about 70 angstrom Ni thick) was imaged onto a sheet of PET using the CREO TRENDSETTER® 800 previously described. Scanning was conducted at powers ranging from 8 to 12 Watts to generate a pattern of a series of interdigitated electrodes on the donor sheet. The exposed donor sheet comprising the patterned Ni catalyst layer was suspended in a electroless deposition bath containing $NiSO_4\text{-}7H_2O$ (28.7 g/L), 70 wt % glycolic acid (25 g/L), sodium acetate (about 60 g/L, to maintain a pH about 4.7) and sodium hypophosphite (25 g/L) at 70° C. After 4 minutes of deposition the patterned donor sheet was removed, rinsed with deionized water and allowed to dry at room temperature (RT) for 1 hour. The sheet resistance of the patterned metal layer was measured to be about 5 Ohms/square. The Ni layer of the original donor sheet had a sheet resistance of about 500 Ohms/square.

EXAMPLE 2

A thermal transfer donor comprising a base film and a catalyst layer was first prepared using the following procedure. A mixture of Ag powder (20.012 g, particle size 90 nm-210 nm), xylenes (17.596 g), ELVACITE® 2028 acrylic polymer (12.348 g, 20 wt % in xylenes) and DEGDB (0.043 g) was treated with a sonication probe (Dukane Co. Model 40TP200, Transducer Model 41C28) for 15 min, during which time the mixture was stirred with a spatula at 5 min intervals. The container with the mixture was placed in a water bath with sonication for 1 h, during which time the mixture was stirred with a spatula at 0.5-h intervals. The mixture was then treated in a water bath at RT with probe sonication for additional 15 min, during which time the mixture was stirred gently with a spatula at 5-minute intervals. The resulting dispersion was filtered twice with 2.0 micron WHATMAN GMF-150 syringe-disc filter (Whatman Inc., Clifton, N.J.).

An organic LTHC Green PET thermal transfer donor base film was cleaned with a pressurized nitrogen stream immediately prior to coating. The above dispersion was drawn on to the base film using a CN#8 rod (Buschman Corporation, Cleveland, Ohio) at 5.8 ft/min utilizing a WATERPROOF Color Versatility coating system (E.I. DuPont De Nemours, Inc., Wilmington, Del.). The wet film was dried for 20 min at 40° C. to provide a thermal transfer donor comprising a base film and a silver catalyst layer.

The donor sheet was imaged using the previously described CREO TRENDSETTER® 800 with a sheet of MELINEX® ST504 receiving the imaged Ag from the donor. Imaging was done with a drum rotation speed of 100 rpm and laser powers of 10.5, 11.25, 12.0 and 12.5 W.

The receiver was removed and a portion of donor having the unexposed patterned catalyst layer provided by imaging at 12.0 W was then prepared for electroplating by applying ¼" wide Cu tape, having a conductive adhesive, along the periphery of the silver pattern. Electroplating was preformed in a Technic, Inc. "Mini Plating Plant 3" electroplating system. The copper plating bath electrolyte was "PC-65" with the brightener "PC 65 B" added at 1% by volume. Both are manufactured by Technic Inc., Cranston R.I. The plating bath was kept at 22° C. during plating. A current density of ~480 Amp/m² was applied to the patterned substrate for 120 sec depositing about 1 μm of copper on the silver pattern to provide a patterned conductive layer having a conductivity of about 4× that of the unplated Ag.

EXAMPLE 3

This example illustrates the use of a donor comprising a plastic substrate and a catalysis layer comprising a catalyst fraction and an adhesion promoter fraction.

A thermal transfer donor comprising a base film and a catalyst layer was first prepared using the following procedure. A mixture of Ag powder (26.246 g, particle size d50=220 nm and d90=430 nm), DI water (10.37 g), CARBOSET GA 2300 styrenic-acrylic polymer (12.393 g, 28 wt % in water) ZONYL FSA surfactant (0.53 g, BYK-025 defoamer (0.308 g) and TYZOR® 212 organo zirconate (1.16 g) was treated with a sonication probe (Dukane Co. Model 40TP200, Transducer Model 41C28) for 15 min, during which time the mixture was stirred with a spatula at 5 min intervals. The container with the mixture was placed in a water bath with sonication for 1 h, during which time the mixture was stirred with a spatula at 0.5 h intervals. The mixture was then treated in a water bath at RT with probe sonication for additional 15 min, during which time the mixture was stirred gently with a spatula at 5-minute intervals. The resulting dispersion was filtered twice with 2.0 micron WHATMAN GFM-150 syringe-disc filter (Whatman Inc., Clifton, N.J.).

An organic LTHC Green PET thermal transfer donor base film was cleaned with a pressurized nitrogen stream immediately prior to coating. The above dispersion was drawn on to the base film using a CN#5 rod (Buschman Corporation, Cleveland, Ohio) at 5.8 ft/min utilizing a WATERPROOF Color Versatility coating system (E.I. DuPont De Nemours, Inc., Wilmington, Del.). The wet films were dried for 20 min at 48° C. to provide a thermal transfer donor comprising a base film and a silver catalyst layer.

The donor sheet is imaged using the previously described CREO TRENDSETTER® 800 with a sheet of MELINEX® ST504 receiving the imaged Ag from the donor. Imaging is done with a drum rotation speed of 100 rpm and laser powers of 10.5, 11.25, 12.0 and 12.5 W. The receiver is removed and a portion of donor having the unexposed patterned catalyst layer is heated at an anneal temperature of about 100-120° C. for 15 min. The sample is then cooled to RT. The patterned substrate is then electroplated with copper using a procedure similar to that disclosed in Example 2 to provide a patterned copper layer.

What is claimed:

1. A method for making a patterned metal layer having high conductivity comprising:
    providing a patterned substrate comprising a patterned catalyst layer on a base substrate; said patterned substrate made by a thermal imaging method comprising:
    (a) providing a thermal transfer donor comprising a base film and a catalyst transfer layer, wherein the catalyst transfer layer comprises: (i) a catalyst fraction; optionally (ii) an adhesion promoter fraction; and, optionally and independently, (iii) a polymer binder fraction;
    (b) contacting the thermal transfer donor with a receiver, wherein the receiver comprises a base layer; and
    (c) removing at least a portion of the catalyst transfer layer from the donor by thermal transfer to provide a patterned donor as said patterned substrate, and an exposed receiver; and
    (d) removing the exposed receiver from the patterned substrate; followed by plating metal onto said patterned substrate, to provide the patterned metal layer in connectivity with the patterned catalyst layer.

2. The method of claim 1 wherein the catalyst fraction is a metal film.

3. The method of claim 1 wherein the catalyst fraction comprises one or more catalyst(s) selected from the group: (1) metal particles, including powders and colloids; (2) metal oxides; (3) organic metal complexes; (4) metal salts; (5) ceramics and other non-conductor powders coated with metal salts, metal oxides, metal complexes, metal or carbon; and (6) carbon in all conductive forms; each metal of (1) to (5) selected from the group consisting of: Ag, Cu, Au, Fe, Ni, Al, Pd, Pt, Ru, Rh, Os, Ir, Sn and alloys thereof.

4. The method of claim 1 wherein the catalyst transfer layer and patterned catalyst layer comprise an adhesion promoter fraction selected from glass frit; metal oxides; metal hydroxides and alkoxides; silicate hydroxides and alkoxides; and organic polyols.

5. The method of claim 1 wherein the catalyst transfer layer and patterned catalyst layer comprise about 1.0 to 99 wt % catalyst fraction; about 0.5 to 10 wt % adhesion promoter fraction; and about 0.5 to 98.5 wt % polymer binder fraction.

6. The method of claim 1 wherein the transferring is achieved through a laser mediated transfer and said laser has an operating wavelength of about 350 to 1500 nm.

7. The method of claim 1 wherein the thermal imaging method further comprises:

(e) heating the patterned substrate to an anneal temperature for an anneal period to provide the annealed patterned substrate; and said plating metal comprises plating said annealed patterned substrate.

8. The method of claim 1 wherein the catalyst transfer layer and patterned catalyst layer further comprise an antireflective agent fraction.

* * * * *

UNITED STATES PATENT AND TRADEMARK OFFICE
CERTIFICATE OF CORRECTION

PATENT NO. : 7,666,567 B2  Page 1 of 1
APPLICATION NO. : 11/877633
DATED : February 23, 2010
INVENTOR(S) : Gao Feng et al.

It is certified that error appears in the above-identified patent and that said Letters Patent is hereby corrected as shown below:

In the claims, column 24, line 2 incorrectly reads "for an anneal period to provide the annealed patterned"

In the claims, column 24, line 2 should read -- for an anneal period <u>before plating</u> to provide the annealed patterned --

Signed and Sealed this

Twenty-ninth Day of June, 2010

David J. Kappos
*Director of the United States Patent and Trademark Office*